United States Patent [19]

Beatty

[11] Patent Number: 5,367,194
[45] Date of Patent: * Nov. 22, 1994

[54] MICROCHIP ASSEMBLY WITH ELECTRICAL ELEMENT IN SEALED CAVITY

[75] Inventor: Christopher C. Beatty, Fort Collins, Colo.

[73] Assignee: Hewlett-Packard Company, Palo Alto, Calif.

[*] Notice: The portion of the term of this patent subsequent to Jan. 5, 2010 has been disclaimed.

[21] Appl. No.: 872,467

[22] Filed: Apr. 23, 1992

Related U.S. Application Data

[63] Continuation of Ser. No. 605,282, Oct. 29, 1990, Pat. No. 5,177,595.

[51] Int. Cl.⁵ ............... H01L 23/02; H01L 23/12; H01L 23/16
[52] U.S. Cl. .................... 257/727; 257/701; 257/704
[58] Field of Search ............... 257/690, 692, 700, 704, 257/710, 701, 727; 338/314, 311, 310, 207, 307, 237

[56] References Cited

U.S. PATENT DOCUMENTS 4,107,555  8/1978  Hass et al. .................... 257/701
5,177,595  1/1993  Beatty .......................... 257/727

Primary Examiner—Rolf Hille
Assistant Examiner—S. V. Clark

[57] ABSTRACT

A method of producing a microchip having at least a portion of an electrical circuit element contained within a hermetically sealed enclosure comprising the steps of: forming a cavity in a first substrate assembly which has a cavity opening at a first surface portion of the first substrate assembly; forming an electrical circuit element and sealing ring from a film applied to a first surface portion of a second substrate assembly with the sealing ring arranged in circumscribing relationship with at least a portion of the circuit element; positioning the first surface portion of the first substrate assembly opposite the first surface portion of the second substrate assembly with the sealing ring located in circumscribing relationship with the cavity opening; sealingly bonding the sealing ring to the first surface portion of the first substrate assembly.

7 Claims, 3 Drawing Sheets

MICROCHIP ASSEMBLY WITH ELECTRICAL ELEMENT IN SEALED CAVITY

This is a continuation of application Ser. No. 605,282 filed Oct. 29, 1990, which is hereby specifically incorporated by reference for all that it discloses now, U.S. Pat. No. 5,177,595.

Background of the Invention

The present invention relates generally to microchip assemblies and, more particularly, to a microchip assembly construction wherein an electrical circuit element is provided in a hermetically sealed cavity.

OBJECTS OF THE INVENTION

It is one object of the invention to provide a microchip assembly having at least a portion of a circuit element provided within a hermetically sealed enclosure.

It is another object of the invention to provide a microchip assembly having a sealing ring positioned around at least a portion of a circuit element and around the periphery of a cavity associated with the circuit element wherein the sealing ring and the circuit element are patterned from a common film layer.

It is another object of the invention to provide a fast and effective method of hermetically sealing at least a portion of a circuit element provided on one substrate assembly within a cavity provided on another substrate assembly.

SUMMARY OF THE INVENTION

The present invention is directed to a microchip assembly formed from two substrate assemblies. The first substrate assembly has a cavity therein.

An electrically conductive, patterned film layer is sandwiched between the exterior surface portions of the two substrate assemblies. The patterned film layer comprises a sealing ring portion positioned in continuous circumscribing relationship with the cavity opening. The sealing ring portion of the patterned film layer is sealingly bonded to both substrate assemblies. The patterned film layer also comprises an electrical circuit element portion. The circuit element portion is bonded to the second substrate assembly. At least a part of the electrical circuit element portion is circumscribed by the sealing ring portion.

The invention is also directed to a method of producing a microchip assembly which has at least a portion of an electrical circuit element contained within a hermetically sealed enclosure. The method may comprise the steps of:

1) forming a cavity in a first substrate assembly which has a cavity opening at a first surface portion of the first substrate assembly;
2) forming an electrical circuit element and sealing ring from a film applied to a first surface portion of a second substrate assembly with the sealing ring arranged in circumscribing relationship with at least a portion of the circuit element;
3) positioning the first surface portion of the first substrate assembly opposite the first surface portion of the second substrate assembly with the sealing ring located in circumscribing relationship with the cavity opening; and
4) sealingly bonding the sealing ring to the first surface portion of the first substrate assembly.

The step of forming an electrical circuit element and sealing ring from a film may comprises patterning an electrical circuit element and sealing ring from a constant thickness film layer whereby the sealing ring and circuit element are of the same thickness and are formed by the same process step.

BRIEF DESCRIPTION OF THE DRAWINGS

An illustrative and presently preferred embodiment of the invention is shown in the accompanying drawings in which.

DETAILED DESCRIPTION OF THE INVENTION

Figure 1:
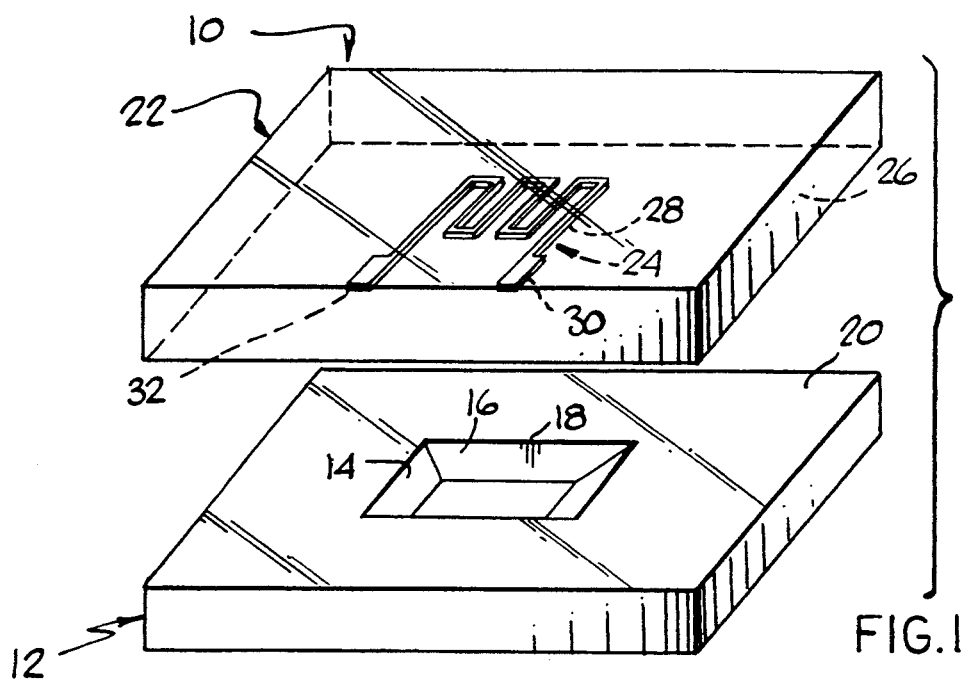
FIG. 1 is an exploded, partially transparent, perspective view of a microchip assembly.

FIG. 1 illustrates a microchip assembly 10 including a first substrate assembly 12 with a first cavity 14 therein. The cavity has an opening 16 with a periphery 18 defined by an encompassing first planar surface portion 20 of the substrate assembly 12. As used herein, "microchip assembly" means a microcircuit assembly comprising one or more substrate assemblies. (As used herein "substrate assembly" means a unitary substrate member consisting of a single, homogeneous material such as silicone and also means any assembly which is formed by providing one or more other material coatings on an underlying unitary substrate member or any assembly which may be formed by etching or otherwise removing material from such coatings or the underlying substrate member.)

Figure 2:
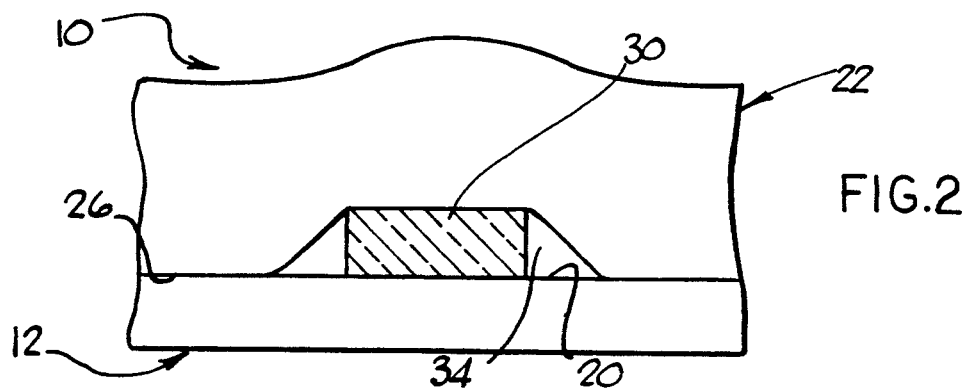
FIG. 2 is a detail cross sectional elevation view of a portion of the microchip assembly of FIG. 1.

A second substrate assembly 22 has an electrical circuit element 24 provided on a first planar surface portion 26 thereof. The first surface portion 20 of the first substrate assembly is bonded to the first surface portion 26 of the second substrate assembly 22 with a heating resistor portion 28 of the circuit element 24 positioned immediately above the opening 16 of cavity 14 and with terminal end portions 30, 32 of the circuit element sandwiched between the first surface portions 20, 26 of the two substrate assemblies. In such an arrangement, as illustrated in FIG. 2, a leakage path 34 is formed adjacent to the terminal ends 30, 32 of the circuit element 24 due to the inability of the substrate members to conform exactly to the portion of the electrical element provided therebetween. Such a leakage path 34 compromises the integrity of the seal around the cavity 14.

FIGS. 3–6 illustrate a microchip assembly 110 comprising a first substrate assembly 112 having a generally planar exterior surface portion 114 and having a cavity 116 therein with an opening 118 with a generally rectangular periphery encompassed by the first surface portion 114.

The microchip assembly comprises a second substrate assembly 132 having a generally planar exterior surface portion 134 positioned in opposite parallel relationship with the exterior surface portion 114 of the first substrate assembly 112.

An electrically conductive, patterned film layer 136 is sandwiched between the exterior surface portions of the first and second substrate assemblies. The patterned film layer 136 is of a constant thickness, e.g. 5 microns, throughout.

The patterned film layer comprises a sealing ring portion 138 positioned in continuous circumscribing relationship with the cavity opening 118. The sealing ring portion of the patterned film layer has opposite first and second surface portions 140, 142, FIGS. 4–6, which make continuous engaging contact with the exterior surface portions 114, 134, respectively, of the first and second substrate assemblies. The sealing ring portion is sealingly bonded to both substrate assemblies at these surface interfaces.

The patterned film layer also comprises an electrical circuit element portion 144. Circuit element portion 144 is bonded to the exterior surface portion 134 of the second substrate assembly 132. The electrical circuit element portion 144 has a heating resistor section 146 and a pair of terminal end pads 148, 150. The end pads may be placed in conductive relationship with an electrical power supply (not shown) by filled vias (not shown) extending through the second substrate assembly.

Figure 7:
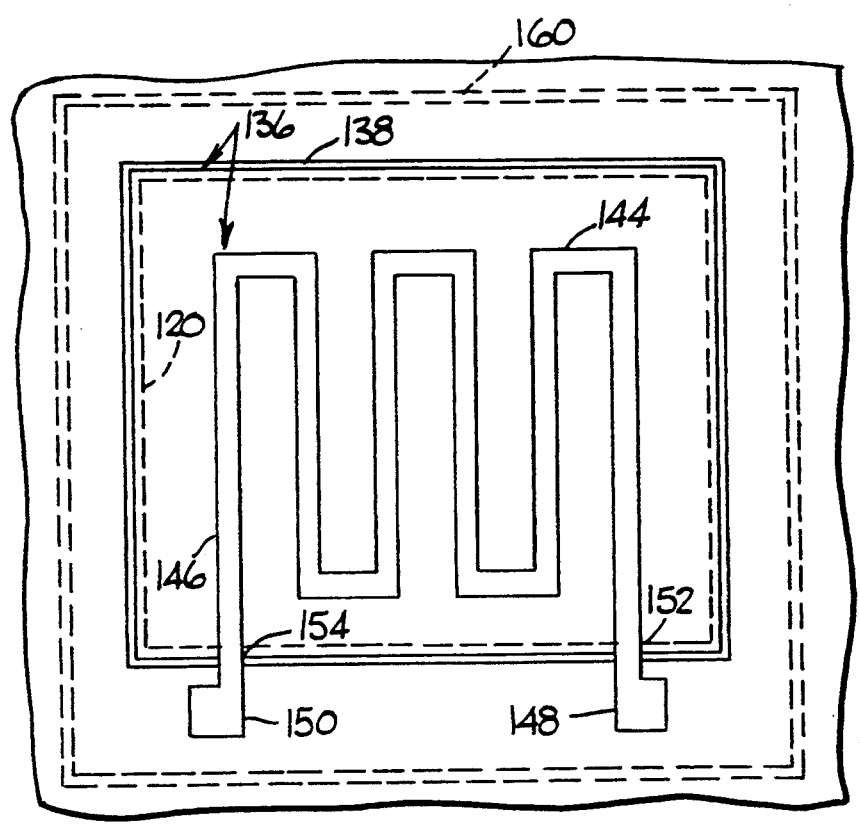
FIG. 7 is a detail plan view of a patterned film layer portion of the microchip assembly of FIG. 3.

In the embodiment shown in FIGS. 3–6 and in solid lines in FIG. 7, a portion of the circuit element portion 144 is encompassed by the sealing ring portion 138 which intersects it at 152 and 154 such that the heating resistor portion 146 lies within the sealing ring portion and the end pads 148, 150 are positioned outside the sealing ring portion. In this embodiment, which is presently the best mode contemplated for practicing the invention, the sealing ring is positioned immediately adjacent to the periphery 120 of cavity 116, e.g. within 50 microns thereof, such relationship being illustrated by the projection of periphery 120 in dashed lines in FIG. 7. The sealing ring and the resistor section each comprise continuous, uniform width bands of film. In this embodiment the band width, i.e. dimension "a", of the sealing ring is constant and is relatively small as compared to the band width, i.e. dimension "b", of the resistor section 146 which may also be a constant width. The minimum width of the resistor section 146 is preferably at least ten times larger than the maximum width of the sealing ring portion 138 and is most preferably at least twenty times larger. When both the resistor section and the sealing ring portion comprise constant width bands and when the ratio of resistor band width to sealing ring band width is 20 to 1, e.g. a resistor band width of 200 microns and a sealing ring band width of 10 microns, the parasitic current loss in the resistor section caused by the sealing ring portion is negligible, approximately 5%. The sealing ring portion has an electrical resistance at least ten times greater than that of the resistor section.

In another embodiment of the invention illustrated in phantom lines in FIG. 7, The sealing ring 138 is replaced by a sealing ring 160 which encompasses the entire circuit element portion 144. In this embodiment the sealing ring portion 160 causes no parasitic current loss; however the sealing ring in this embodiment is necessarily positioned more remotely from the periphery of cavity 120.

The method of producing a microchip assembly 110 such as described above which has at least a portion of an electrical circuit element 144 contained within a hermetically sealed enclosure may comprise the steps of:

1) forming a cavity 116 in a first substrate assembly 112 which has a cavity opening 118 at a first surface portion 114 of the first substrate assembly;
2) forming an electrical circuit element 144 and sealing ring 138 from a film applied to a first surface portion of a second substrate assembly 132 with the sealing ring arranged in circumscribing relationship with at least a portion of the circuit element 144;
3) positioning the first surface portion 114 of the first substrate assembly 112 opposite the first surface portion 134 of the second substrate assembly 132 with the sealing ring 138 located in circumscribing relationship with the cavity opening 118;
4) sealingly bonding the sealing ring 138 to the first surface portion 114 of the first substrate assembly 112.

The step of forming an electrical circuit element 144 and sealing ring 138 from a film 136 may comprises forming an electrical circuit element and sealing ring from a constant thickness film layer whereby the sealing ring and circuit element are of the same thickness and are formed by the same process step.

The step of forming an electrical circuit element 144 and sealing ring 138 from a film applied to a first surface portion 134 of a second substrate assembly 132 with the sealing ring arranged in circumscribing relationship with at least a portion of the circuit element may comprise forming a sealing ring 138 which encompasses only a portion of the formed electrical circuit element 144 formed from the film.

The step of forming an electrical circuit element 144 and sealing ring 160 from a film 136 applied to a first surface portion 134 of a second substrate assembly 132 with the sealing ring arranged in circumscribing relationship with at least a portion of the circuit element may comprises forming a sealing ring 160 which encompasses the entire electrical circuit element 144 formed from the film.

Having thus described a method of making microchip assembly 110 in general, one particular method of making a microchip assembly 110 will now be described in greater detail.

Figure 8:
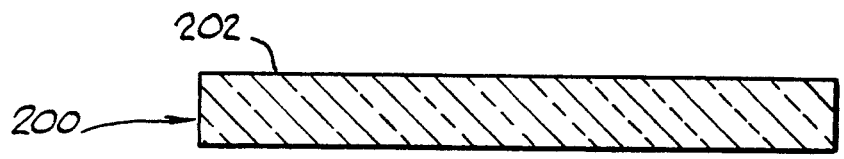
FIGS. 8–15 are cross sectional side elevation views showing various process steps used in the formation of a microchip assembly such as that illustrated in FIG. 3.

FIG. 8 illustrates a first substrate member 200 which may be a parallelepiped-shaped pyrex, silk, con, or sapphire substrate member which may be 500 microns thick and which has a generally planar first surface 202.

Figure 9:
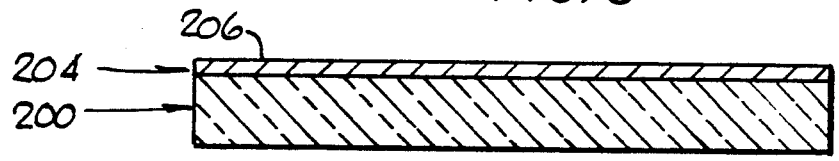

The first surface 202 of substrate member 200 is coated, such as by sputter coating, with a conductive film such as an aluminum film 204 or other conductive metal film, FIG. 9. The film coating has a generally planar exterior surface portion 206 and has a constant thickness, e.g. 5 microns.

Figure 10:
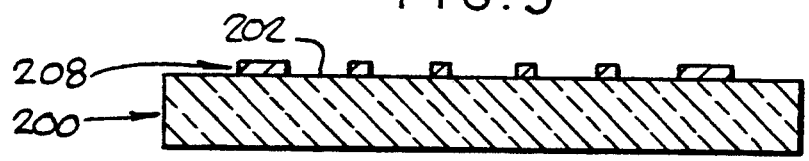

Next, as shown in FIG. 10, the film layer 204 is etched to form a patterned conductor layer 208 so as to provide a sealing ring and electrical conductor element such as that shown in detail at 136 in FIG. 7. An aluminum film layer may be etched with $H_3PO_4$ (phosphoric acid).

Figure 11:
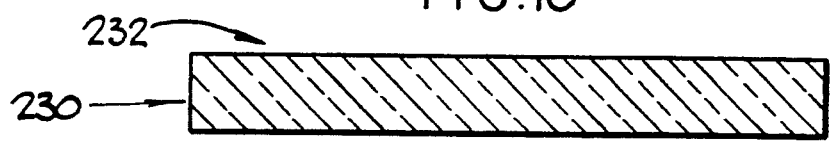

FIG. 11 illustrates a second substrate member 230 which may be a parallelepiped-shaped pyrex, silicon, or sapphire substrate member which may be 500 microns thick and which has a generally planar first surface 232.

Figure 12:
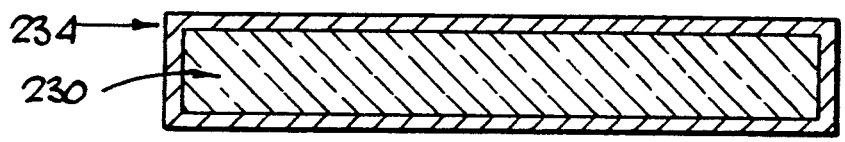

As shown by FIG. 12 the substrate member may be coated with a layer 234 of LPCVD (low pressure chemical vapor deposit) silicon nitride which may have a uniform thickness of 0.2 microns.

Figure 13:
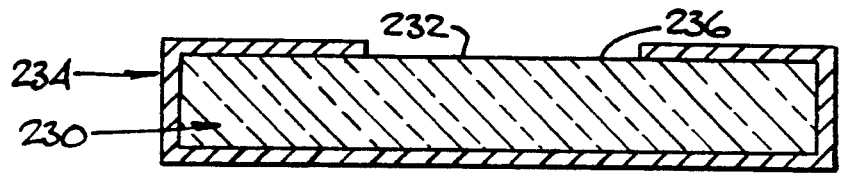

Next, as illustrated in FIG. 13 layer 234 is etched to form a cavity 236 therein which exposes surface 232 of substrate member 230. The etching may be performed using $CF_4$ (carbon tetrafluoride).

Figure 14:
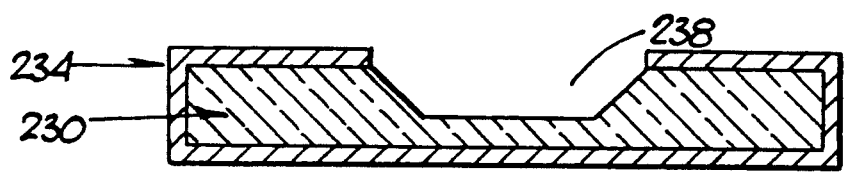

Next, as shown in FIG. 14, the exposed surface 232 is etched, as with $KOH/ISO/H_2O$ (potassium hydroxide/isopropanol/water) to provide a cavity 238 therein which may have a depth of 500 microns and which may be 200 microns wide and 200 microns long.

Figure 15:
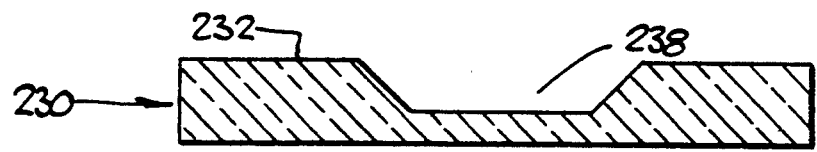

The nitride layer 234 is then stripped off as with $H_3PO_4$ (phosphoric acid), FIG. 15.

The two substrate assemblies thus formed are then aligned with the first surfaces 202, 232 thereof positioned opposite one another and with a circuit element portion of the patterned layer 208 positioned in registry with cavity 238 and with a sealing ring portion of layer 208 positioned in circumscribing relationship with cavity 238. The substrate assemblies are then urged together such that the sealing ring portion of the patterned layer 208 is engaged by surface 232.

Figure 3:
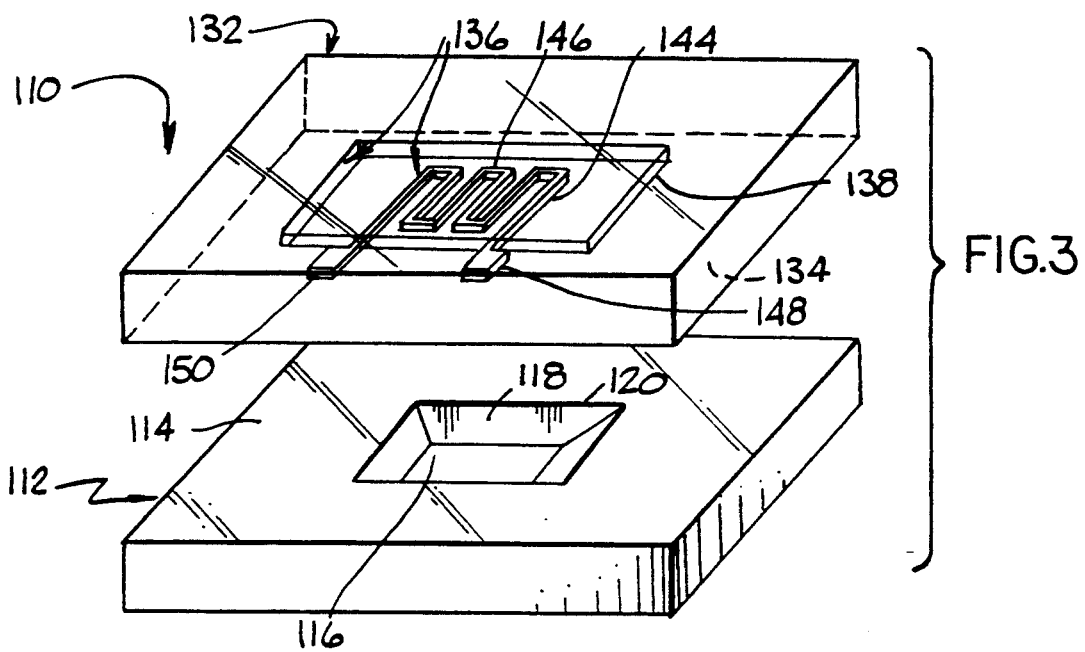
FIG. 3 is an exploded, partially transparent, perspective view of a microchip assembly having a hermetically sealed cavity.
Figure 4:
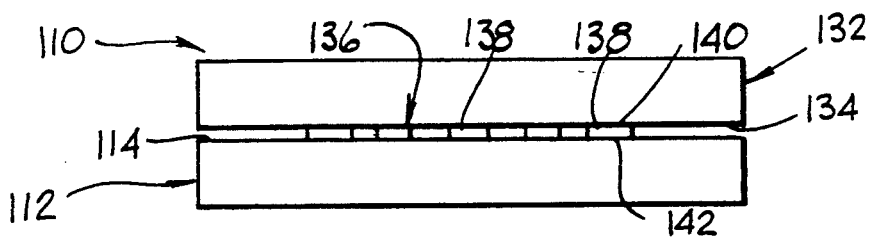
FIG. 4 is a front elevation view of the microchip assembly of FIG. 3.
Figure 5:
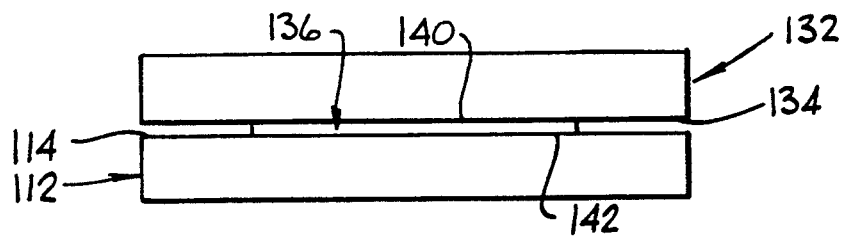
FIG. 5 is a rear elevation view of the microchip assembly of FIG. 3.
Figure 6:
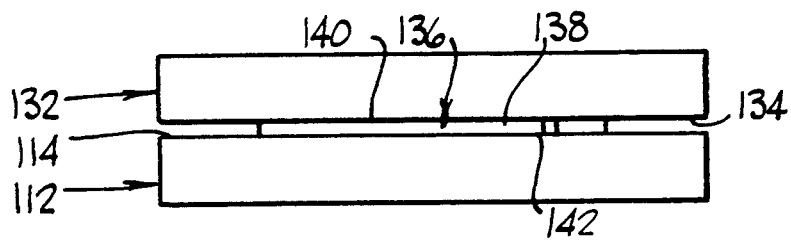
FIG. 6 is a left side elevation view of the microchip assembly of FIG. 3 of which the right side elevation view is a mirror image.

Finally the portion of the patterned conductor layer which is engaged by surface 232 is sealingly bonded thereto to form a microchip assembly such as that shown at 110 in FIG. 3. For example when the conductor layer 208 is an aluminum conductor layer and the second substrate is silicon a eutectic bonding therebetween may be achieved by heating the assembly in a furnace at a temperature of 575° C. for a period of 30 minutes. Eutectic bonding could also be achieved by using rapid-thermal annealing at 575° C. for a period of 90 seconds. An aluminum patterned layer 208 could be electrostatically bonded to second substrate 230 when the second substrate is composed of pyrex or other sodium bearing glasses.

In the preferred embodiment, bonding of the first and second substrates is achieved solely through use of the sealing ring and portions of the resistor. However, to achieve a lighter strength bond, additional isolated bonding areas may be patterned from the conductor layer at the same time the sealing ring and resistor are patterned therefrom. These additional related conductor regions are then used to supplement the bonding provided by the sealing ring and resistor.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A microchip assembly comprising:
   a first substrate assembly having a generally planar exterior surface portion and having a cavity therein with an opening encompassed by said planar exterior surface portion;
   a second substrate assembly having a generally planar exterior surface portion positioned in opposite parallel relationship with said exterior surface portion of said first substrate assembly;
   a patterned conductive film layer sandwiched between said exterior surface portions of said first and second substrate assemblies comprising:
      a sealing ring portion positioned in continuous circumscribing relationship with said cavity opening and continuous engaging relationship with said exterior surface portions of said first and second substrate assemblies and sealingly bonded thereto;
      an electrical circuit element portion, having at least a part thereof encompassed by said sealing ring portion, bonded to said exterior surface portion of said second substrate assembly.

2. The invention of claim 1 wherein said patterned film layer is of a constant thickness.

3. The invention of claim 1 wherein said sealing ring portion intersects said electrical circuit element portion.

4. The invention of claim 3 wherein said sealing ring portion is positioned immediately adjacent the periphery of said cavity opening.

5. The invention of claim 3 wherein said circuit element portion comprises terminal end pads positioned on said generally planar exterior surface portion of said second substrate assembly which are not circumscribed by said sealing ring portion.

6. The invention of claim 1 wherein said electrical circuit portion is not intersected by said sealing ring portion and is entirely circumscribed thereby.

7. A device comprising:
   a first substrate assembly having a generally planar exterior surface portion and having a cavity therein with an opening encompassed by said first surface portion;
   a second substrate assembly having a generally planar exterior surface portion positioned in opposite parallel relationship with said exterior surface portion of said first substrate assembly;
   a patterned conductive film layer sandwiched between said exterior surface portions of said first and second substrate assemblies comprising:
      a sealing ring portion positioned in continuous circumscribing relationship with said cavity opening and continuous engaging relationship with said exterior surface portions of said first and second substrate assemblies and sealingly bonded thereto;
      an electrical circuit element portion, having at least a part thereof encompassed by said sealing ring portion, bonded to said exterior surface portion of said second substrate assembly.

* * * * *